United States Patent
Kida et al.

(10) Patent No.: US 7,250,368 B2
(45) Date of Patent: Jul. 31, 2007

(54) SEMICONDUCTOR WAFER MANUFACTURING METHOD AND WAFER

(75) Inventors: Takahiro Kida, Kosyoku (JP); Seiichi Miyazaki, Kosyoku (JP); Kazuhiko Nishimura, Kosyoku (JP); Nobuyuki Hayashi, Kosyoku (JP); Katsunori Arai, Kosyoku (JP)

(73) Assignee: Shin-Etsu Handotai Co., Ltd., Tokyo (JP)

( * ) Notice: Subject to any disclaimer, the term of this patent is extended or adjusted under 35 U.S.C. 154(b) by 259 days.

(21) Appl. No.: 10/512,637

(22) PCT Filed: Apr. 24, 2003

(86) PCT No.: PCT/JP03/05259

§ 371 (c)(1),
(2), (4) Date: Oct. 27, 2004

(87) PCT Pub. No.: WO03/094215

PCT Pub. Date: Nov. 13, 2003

(65) Prior Publication Data
US 2005/0142882 A1    Jun. 30, 2005

(30) Foreign Application Priority Data
Apr. 30, 2002 (JP) .............................. 2002-128550

(51) Int. Cl.
*H01L 21/304* (2006.01)
(52) U.S. Cl. ..................... 438/690; 438/928
(58) Field of Classification Search ............... 438/690, 438/928
See application file for complete search history.

(56) References Cited

U.S. PATENT DOCUMENTS

| 5,821,166 A | * | 10/1998 | Hajime et al. ............. 438/691 |
| 6,376,378 B1 | * | 4/2002 | Chen et al. ................. 438/692 |
| 6,530,826 B2 | * | 3/2003 | Wenski et al. ................ 451/41 |

(Continued)

FOREIGN PATENT DOCUMENTS

EP    1 189 266 A1    3/2002

(Continued)

OTHER PUBLICATIONS

International Search Report for PCT/JP03/05259 mailed on Jul. 22, 2003.
Supplementary European Search Report, Reference EP32833TS900dfi (dated Dec. 14, 2006).

*Primary Examiner*—M. Wilczewski
(74) *Attorney, Agent, or Firm*—Rader, Fishman & Grauer PLLC

(57) ABSTRACT

The present invention provides a method for manufacturing a semiconductor wafer capable of manufacturing a wafer without ring-like sag in an outer peripheral portion thereof when polishing an alkali etched wafer, and a wafer without the ring-like sag in an outer peripheral portion thereof. The present invention comprises: a back surface part polishing and edge polishing step for performing back surface part polishing and edge polishing such that mirror polishing is performed on a chamfered portion and an inner part extending inward from a boundary between the chamfered portion and a back surface of a starting wafer; and a front surface polishing step for mirror polishing a front surface of the wafer subjected to the back surface part polishing and edge polishing step holding the wafer by the back surface thereof.

19 Claims, 6 Drawing Sheets

U.S. PATENT DOCUMENTS

| | | | |
|---|---|---|---|
| 6,566,267 B1* | 5/2003 | Wenski | 438/692 |
| 2001/0014570 A1* | 8/2001 | Wenski et al. | 451/41 |
| 2001/0039119 A1* | 11/2001 | Kishimoto | 438/690 |
| 2002/0037650 A1* | 3/2002 | Kishimoto | 438/692 |
| 2002/0077039 A1* | 6/2002 | Wenski et al. | 451/41 |
| 2003/0008478 A1* | 1/2003 | Abe et al. | 438/459 |
| 2003/0060050 A1* | 3/2003 | Pietsch et al. | 438/692 |
| 2003/0068891 A1* | 4/2003 | Bang et al. | 438/689 |
| 2003/0109139 A1* | 6/2003 | Wenski et al. | 438/692 |
| 2003/0171075 A1* | 9/2003 | Nihonmatsu et al. | 451/41 |
| 2004/0043616 A1* | 3/2004 | Harrison et al. | 438/690 |
| 2004/0108297 A1* | 6/2004 | Erk et al. | 216/2 |
| 2004/0195657 A1* | 10/2004 | Miyashita et al. | 257/618 |
| 2005/0255610 A1* | 11/2005 | Sato et al. | 438/14 |

FOREIGN PATENT DOCUMENTS

| | | |
|---|---|---|
| EP | 1 313 135 A1 | 5/2003 |
| JP | 11-188590 A1 | 7/1999 |
| JP | 11-207583 A1 | 8/1999 |
| JP | 2000-243731 A1 | 9/2000 |

* cited by examiner

SEMICONDUCTOR WAFER MANUFACTURING METHOD AND WAFER

TECHNICAL FIELD

The present invention relates to a method for manufacturing a semiconductor wafer (hereinafter also referred to simply as a wafer) realizing high flatness, and particularly, to a method for manufacturing a wafer with high flatness in a process for manufacturing a semiconductor having an alkali etching step, and besides, a process for manufacturing a semiconductor wafer having a mirror polishing step with a wax mount system.

BACKGROUND ART

A semiconductor wafer has been conventionally manufactured according to a procedure as shown in a flowchart of FIG. 7. The conventional method for manufacturing a semiconductor wafer includes: a slicing step for slicing a single crystal rod of silicon or the like into wafers (step 100); a chamfering step for chamfering a peripheral portion of a sliced wafer (step 102); a lapping step for lapping a chamfered wafer (step 104); an etching step for etching a lapped wafer (step 106); and a mirror polishing step for mirror polishing at least a front surface of an etched wafer (step 108). Incidentally, in this specification, a wafer prior to the mirror polishing step is also referred to as a starting wafer.

Of the steps, the chamfering (the chamfering step) is an indispensable step because unless the chamfering step is applied to a wafer peripheral portion, a single crystal of silicon or the like is very hard and brittle so that braking and chipping of a semiconductor wafer occur during a process for manufacturing the semiconductor wafer and a fabrication process for a device, which results in reduction in product yield in the processes and degradation in characteristics of a device. As the chamfering processes, there are known mainly a process rounding a wafer peripheral portion with a chemical method, and a process chamfering a peripheral portion thereof mechanically using a grinding stone. The latter mechanical process has generally been adopted in a recent trend of larger diameter of wafers because of good stability of wafer quality and excellence in dimensional precision.

While it is required to firmly hold a wafer in order to process the periphery thereof by means of a mechanical method, the wafer is held on the main surfaces thereof from the nature of processing the wafer periphery, and in the processing the main surface thereof is subject to scratches and contamination. However, the main surface of the wafer is used as a surface on which a device pattern is illustrated, so the scratches and contamination on the main surface of the wafer has to be avoided at the lowest possible level. Therefore, generally, the chamfering is performed on a wafer immediately after the wafer is obtained by slicing a single crystal rod and thereafter, the main surfaces of the wafer are ground by lapping so as to make wafer thickness uniform, thereby the scratches and contamination on the main surfaces generated during the chamfering being removed.

In the mean time, along with progress toward high integration in the semiconductor technology in recent years, there have been demands for improvement in flatness and dimensional precision of chamfered surfaces of the wafer. Conventionally, the dimensional precision of the chamfered surface has been improved not only by increasing smoothness of the chamfered surface using as a grinding stone abrasive grains with small sizes at the sacrifice of productivity in chamfering, but also by improving precision in a chamfering machine and a control technique therefor.

However, when performing the lapping after the chamfering, reduction occurs in an effect of improvement on quality such as smoothness and dimensional precision of the chamfered surface. The lapping is performed such that a wafer is sandwiched between an upper table and a lower table, a mixture obtained by mixing abrasive grains into a lapping solution (an abrasive agent) is supplied into clearances between the wafer and the upper and lower tables, and the wafer and the tables are rubbed against each other under a pressure applied therebetween to thereby grind the main surfaces of the wafer, in which situation a wafer holding metal jig is used for holding the wafer. The abrasive grains put between the wafer holding metal jig and the wafer to grind the peripheral portion of the wafer, whereby the wafer shape gets worse. Since abrasive grains used in lapping is coarser compared with those used in chamfering, roughness of the chamfered surface increases so that smoothness and dimensional precision of the chamfered surface cannot maintain the level at the time when the chamfering operation ends.

Therefore, there has been a case where chamfering is performed after lapping. With such a process adopted, a semiconductor wafer can be manufactured without losing smoothness and dimensional precision of the chamfered surface at the time when the chamfering operation ends. Furthermore, since thickness of the wafer has been made uniform after the lapping, an advantage is provided that dimensional precision of the chamfered surface can be easily ensured in subsequent chamfering.

Thereafter, acid or alkali etching treatment is performed to remove processing damage or the like generated in lapping and other steps.

Various ways have been available in polishing a wafer and in an example, a wafer is adhered to a polishing block, the wafer on the polishing block is pressed to a polishing cloth stuck on a polishing table and the wafer is polished while being rubbed on the polishing cloth. There have been employed two systems in adhering a wafer to the polishing block: a wax mount system in which a wafer is stuck with wax and a waxless mount system in which a wafer is firmly held by vacuum suction or the like without using wax. The waxless system not only requires neither of an adhering operation of a wafer to a polishing block and a releasing operation of the wafer from the polishing block, but also is easy in cleaning the wafer after polishing; therefore, this system is advantageous in aspects of productivity and cost. However, the waxless system has problems in respect of flatness of the polished wafer, local etching on the back surface of the wafer caused by polishing slurry and others, so the wax mount system stands as the present mainstream.

In one adhering manner of the wax mount system, a wafer is sucked at the front surface thereof with a vacuum suction device, wax is applied on the back surface thereof, the back surface is directed downward, the wafer is released from the vacuum suction device near the polishing block, and by dropping the wafer onto the polishing block due to its own weight, the wafer is adhered to the polishing block. In another adhering manner, using a vacuum suction device provided with an air pad, a wafer coated with wax is pressed to the polishing block at the central portion thereof as it is or in a state where the wafer is bent, in which situation by releasing the wafer from the vacuum suction device, the wafer is adhered to the polishing block. There are used as the polishing block those made of glass such as borosilicate glass, or ceramics such as alumina and silicon carbide.

Along with increasingly severer requests for wafer flatness, a polishing block with high rigidity made of ceramics is becoming the mainstream.

There may be also available a method for polishing simultaneously the front and back surfaces of a wafer and a polishing process including a step for lightly polishing the back surface of a wafer to obtain a wafer with high flatness.

Thus, in a prior art practice, a silicon single crystal ingot is sliced into silicon wafers and the following steps are thereafter applied sequentially to the sliced wafer: chamfering, lapping, etching and the like, followed by mirror polishing of at least the wafer main surface. In addition, edge polishing is performed in which the chamfered portion is mirror polished with a cylindrical buff or the like.

While a final configuration of the wafer is determined in a wafer polishing step, wafer flatness in the wafer polishing step is greatly affected by a state of the wafer in the previous steps (steps prior to polishing).

That is, for example, a configuration of a wafer etched in the previous step (hereinafter also referred to as CW for short) exerts an influence on a configuration of a polished wafer. For example, if the wafer is subjected to acid etching, waviness of the wafer is great, so it is difficult to improve flatness of the wafer. By reducing the waviness of the wafer, the flatness thereof is improved. The reduction of the waviness is realized with adoption of a combination of alkali etching and acid etching, improved alkali etching or the like.

To perform alkali etching is advantageous in aspects of improvement of the wafer flatness and reduction of the wafer manufacturing cost, whereas with such an etching solution applied, ring-like sag is observed on an outer peripheral portion of the polished wafer, which leads to local degradation in flatness.

SFQR (Site Front Least Squares Range) within a wafer surface is greatly improved by alkali etching, whereas a value of SFQRmax is worsened due to the sag on the outer peripheral portion as described above; therefore the wafer is not evaluated as one with very high flatness as a whole. Especially, in recent years a wafer is requested with high flatness as far as the very outer peripheral portion thereof, and hence an adverse influence of the sag in the outer peripheral portion has disabled effective use of the merit of the alkali etching.

The term "SFQR (Site Front Least Squares Range)" means a value expressing the maximum value of recessions and projections against an average plane of a front side reference for flatness which is calculated at each site (a value evaluated at each site, that is, the sum of the absolute values of maximum displacements of the + and − sides from the reference plane which is the in-site plane obtained by calculating data in set sites using a method of least squares) and the term "SFQRmax" is the maximum value among the SFQR values of all of the sites on a wafer.

The alkali etched wafer exhibits good SFQR values in the wafer surface but has sag on the outer peripheral portion, so the SFQRmax is present in the outer peripheral portion, which degrades an apparent quality of the wafer.

DISCLOSURE OF THE INVENTION

The present invention has been made in light of the problem and it is an object of the present invention to provide a method for manufacturing a semiconductor wafer capable of manufacturing a wafer without ring-like sag in an outer peripheral portion thereof in polishing an alkali etched wafer (CW), and a wafer without the ring-like sag in the outer peripheral portion thereof.

A first aspect of a method for manufacturing a semiconductor wafer according to the present invention comprises: a back surface part polishing and edge polishing step for performing back surface part polishing and edge polishing such that mirror polishing is performed on a chamfered portion and an inner part extending inward from a boundary between the chamfered portion and a back surface of a starting wafer; and a front surface polishing step for mirror polishing a front surface of the wafer subjected to the back surface part polishing and edge polishing step holding the wafer by the back surface thereof.

A second aspect of a method for manufacturing a semiconductor wafer according to the present invention comprises: a back surface part polishing step for mirror polishing an inner part extending inward from the boundary between a chamfered portion and a back surface of a starting wafer; and a front surface polishing step for mirror polishing a front surface of the wafer subjected to the back surface part polishing step holding the wafer by the back surface thereof. The second aspect further comprises an edge polishing step for edge polishing the wafer subjected to the back surface part polishing step, wherein the front surface of the edge polished wafer is mirror polished.

By mirror polishing an inner part extending inward from the boundary between a chamfered portion and a back surface of a starting wafer, followed by polishing a front surface of the wafer as shown in the first and second aspects, it is possible to prevent sag in an outer peripheral portion of the wafer and to manufacture the wafer with high flatness as far as the outer peripheral portion thereof.

It is especially preferable to adopt a wax mount system in the front surface polishing step for mirror polishing a front surface of the wafer.

It is preferable to use an alkali etched wafer as the starting wafer. By using the alkali etched wafer, there can be obtained a wafer with high flatness and few undulation.

A third aspect of a method for manufacturing a semiconductor wafer according to the present invention comprises: a slicing step for slicing a single crystal rod into wafers each in the shape of a thin plate; a first chamfering step for chamfering the sliced wafers; a lapping step for lapping the chamfered wafers; a second chamfering step for chamfering the lapped wafers for the second time; an etching step for alkali etching the twice chamfered wafer; a back surface part polishing step for mirror polishing an inner part extending inward from the boundary between a chamfered portion and a back surface of a starting wafer; and a front surface polishing step for mirror polishing a front surface of the wafer subjected to the back surface part polishing step holding the wafer by the back surface thereof. According to such steps, a wafer with high flatness can be manufactured.

A fourth aspect of a method for manufacturing a semiconductor wafer according to the present invention comprises: a slicing step for slicing a single crystal rod into wafers each in the shape of a thin plate; a first chamfering step for chamfering the sliced wafers; a lapping step for lapping the chamfered wafers; a second chamfering step for chamfering the lapped wafers for the second time; an etching step for alkali etching the twice chamfered wafer; a back surface part polishing step for mirror polishing an inner part extending inward from the boundary between a chamfered portion and a back surface of a starting wafer; and a front surface polishing step for mirror polishing a front surface of the wafer subjected to the back surface part polishing step holding the wafer by the back surface thereof.

The fourth aspect further comprises an edge polishing step for edge polishing the wafer subjected to the back surface part polishing step, wherein the front surface of the edge polished wafer is mirror polished.

As shown in any of the first to fourth aspects of a method for manufacturing a semiconductor wafer according to the present invention, by altering a configuration of the boundary of the chamfered portion on an adhering surface, ring-like sag in an outer peripheral portion is reduced and thereby the SFQRmax is improved.

The mirror polished area of the inner part extending inward from the boundary between the chamfered portion and the back surface of the wafer is preferably 1000 μm or less and more preferably on the order of 500 μm to 700 μm toward the center of the wafer from the boundary. With performing such polishing, flatness of the wafer front surface is improved.

In the front surface polishing step, it is preferable that the wafer is adhered with wax and held by the back surface thereof and the front surface thereof is mirror polished.

The front surface polishing step is, in other words, a wafer polishing method according to the wax mount system and, to put it more concretely, a method for polishing a front surface of a wafer in such a way that a wafer is adhered with wax by the back surface thereof and the front surface of the wafer and a polishing cloth are rubbed against each other while polishing slurry is supplied.

A wafer according to the present invention is such that a front surface thereof is a mirror polished surface and the back surface thereof is an alkali etched surface, wherein an inner part extending from the boundary between a chamfered portion and the back surface of the wafer is mirror polished, and the mirror polished area of the inner part extending inward from the boundary between the chamfered portion and the back surface of the wafer is in the range of 500 μm to 700 μm toward the center of the wafer from the boundary.

In the wafer of the present invention, it is especially possible that glossiness of the back surface thereof is in the range of 40±5% and the SFQRmax thereof is 0.11 μm or less.

According to the method for manufacturing a semiconductor wafer of the present invention, a wafer having such a quality level can be easily manufactured. Moreover, a wafer of the present invention is a wafer with high flatness as far as an outer peripheral portion of the wafer and contributes to improvement on product yield or the like in a device fabrication process. Still moreover, a wafer of the present invention is rich in its versatility since the back surface thereof is close to a conventional surface state.

BEST MODE FOR CARRYING OUT THE INVENTION

Figure 1:
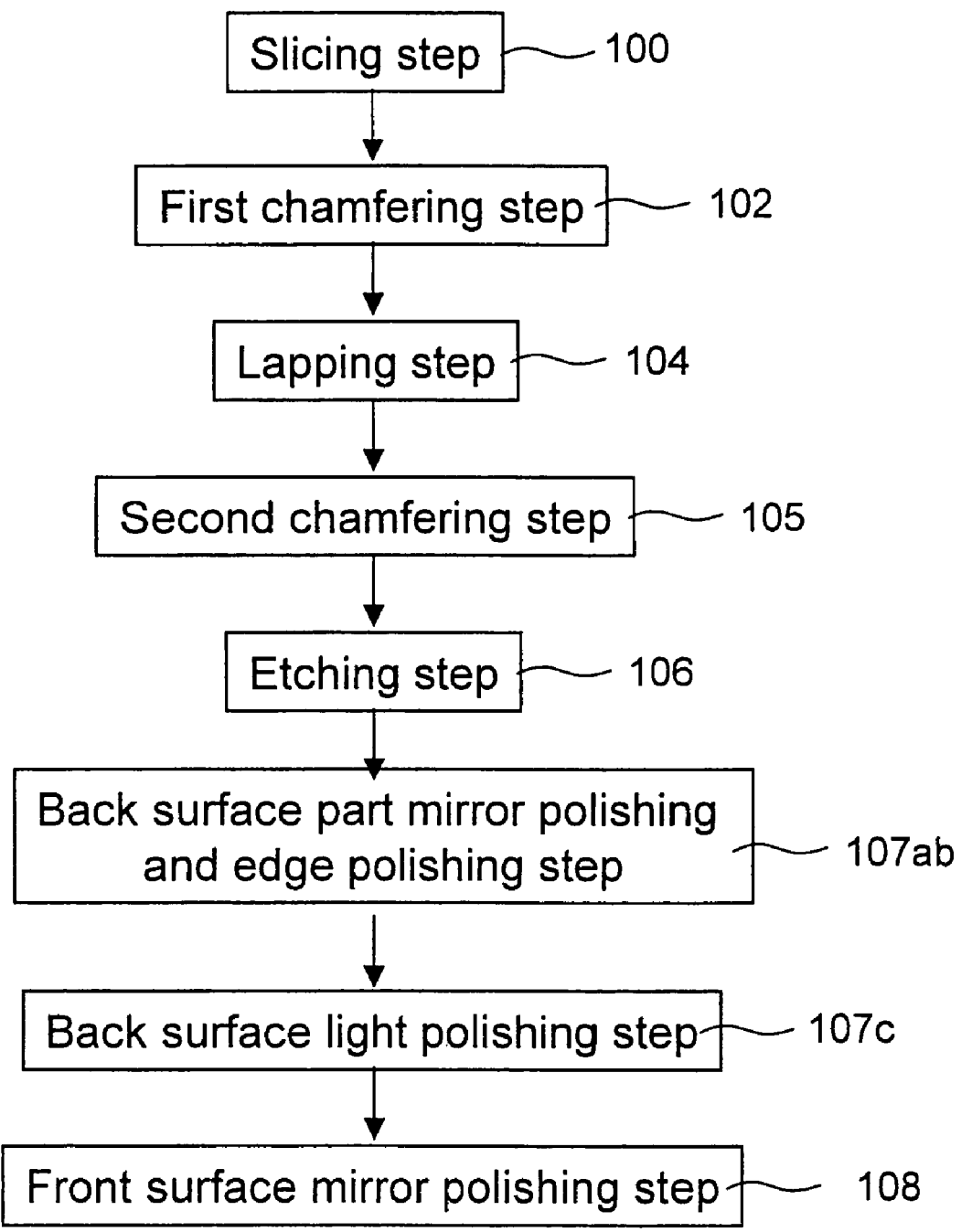
FIG. 1 is a flowchart showing an example of a step sequence of a method for manufacturing a semiconductor wafer according to the present invention.

Description will be given of embodiments of the present invention below based on the accompanying drawings and it is needless to say that the examples shown in the figures are shown by way of illustration only and various modifications or variations can be implemented as far as not departing from the technical concept of the present invention.

Various kinds of etching treatment may be performed in order to make global flatness of a semiconductor wafer (flatness within a wafer surface) better and there are available, for example, a combination of alkali etching and acid etching, improvement on alkali etching and others. Thus, from aspects of improvement on flatness and reduction in cost, it is advantageous to perform alkali etching. However, in etching using an alkali etching solution, after polishing the etched wafer, ring-like sag is observed in an outer peripheral portion of the polished wafer, resulting in degradation in flatness.

It is conceivable that causes for sag in an outer peripheral portion of the polished wafer include: a problem occurring in polishing wherein a polishing cloth sinks to thereby render excessive polishing in the outer peripheral portion of the wafer; a problem occurring in adhering wherein when the wafer is adhered with wax in, for example, the wax mount system, the outer peripheral portion of the wafer is adhered in a raised state and the raised outer peripheral portion is excessively polished; and a problem associated with a starting wafer such as a surface configuration prior to polishing, for example, surface roughness of the alkali etched wafer mentioned above, differences among configurations of the wafer outer peripheral portions, and others.

The present inventors have conducted serious investigations into causes for generation of sag, and as a result, have reached a conception that one of the causes is due to the fact that a load on an outer peripheral portion of a wafer is higher compared with that on an area extending inward from the outer peripheral portion during polishing. Especially it was found that a configuration of an outer peripheral portion of a starting wafer raises a problem, and in order to reduce sag, it is effective to change an angular configuration of the boundary of the chamfered portion of the alkali etched wafer to a round configuration by edge polishing. With the edge polishing applied, it was possible to uniformly control a load on the outer peripheral portion and that on the surface excluding the outer peripheral portion during polishing. It was also found that the effect of the edge polishing is especially great in the wax mount system and a thickness of wax increases in an inner part extending inward from the boundary of the chamfered portion, which in turn enhances elasticity of the inner part. It was further found that a stress occurring in the outer peripheral portion during polishing is distributed, thereby the outer peripheral sag being reduced to a lower level, which has led to completion of the present invention.

The main point of the method for manufacturing a semiconductor wafer according to the present invention is that there is mirror polished an inner part extending inward from a boundary between a chamfered portion and a back surface of a starting wafer, and then a front surface of the wafer with a back surface part mirror polished is mirror polished, especially by using the wax mount system, a wafer with high flatness being manufactured.

The above described mirror polishing of the inner part extending inward from the boundary between the chamfered portion and the back surface of the starting wafer may be implemented either by edge polishing the chamfered portion together with the inner part extending inward from the boundary between the chamfered portion and the back surface of the starting wafer or by mirror polishing the inner part of the back surface in another step different from the edge polishing step. Incidentally, when mirror polishing the inner part of the back surface in another step different from the edge polishing step, it is a matter of course that edge polishing is performed separately.

Figure 2:
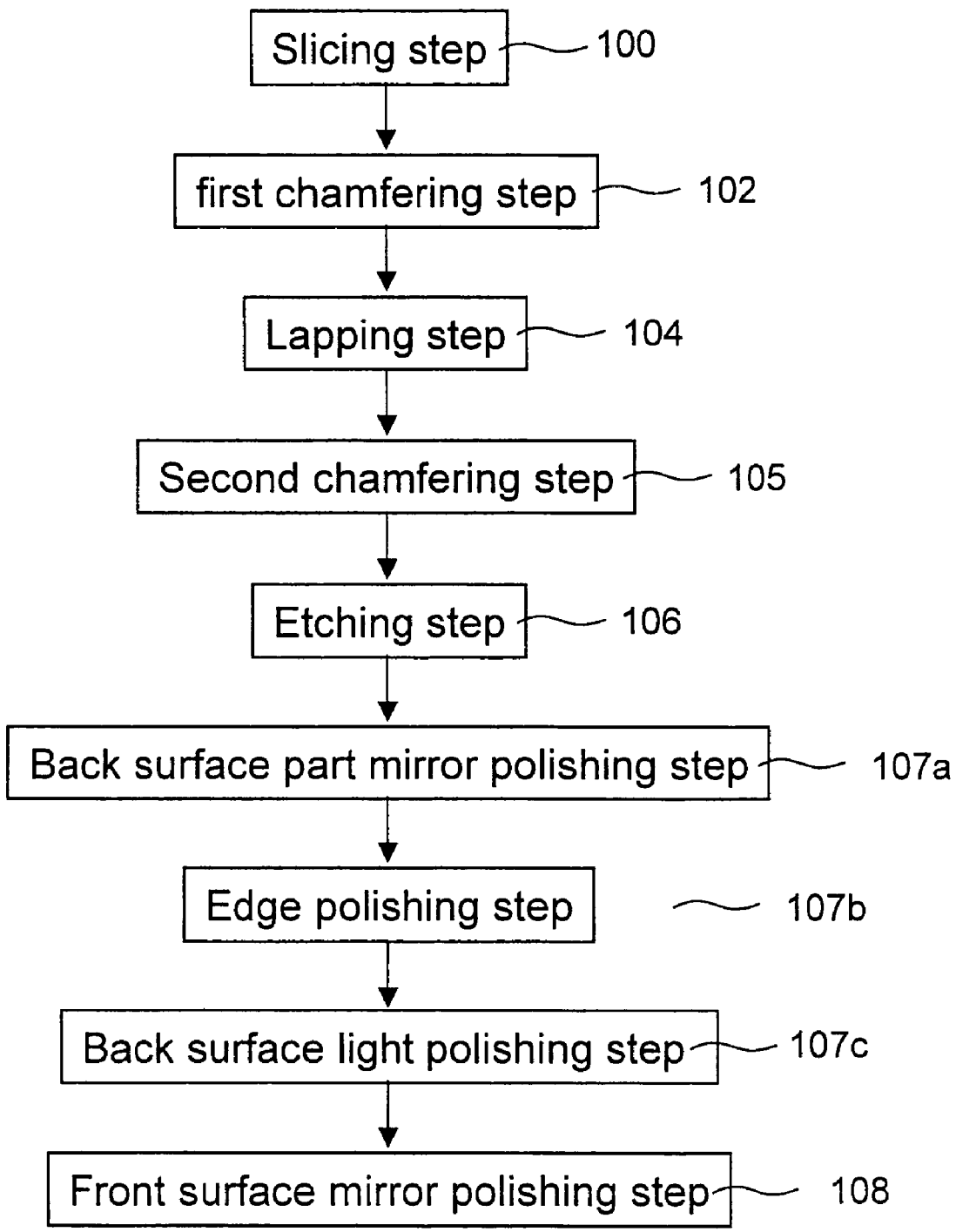
FIG. 2 is a flowchart showing another example of a step sequence of a method for manufacturing a semiconductor wafer according to the present invention.

FIG. 1 is a flowchart showing an example of a step sequence of a method for manufacturing a semiconductor wafer according to the present invention and FIG. 2 is a flowchart showing another example of a step sequence of a method for manufacturing a semiconductor wafer according to the present invention.

In FIG. 1, the following steps are similar to those in the conventional method for manufacturing a semiconductor wafer (FIG. 7): a slicing step for slicing a single crystal rod of silicon or the like (step 100); a first chamfering step for chamfering an outer peripheral portion of the obtained sliced wafer (step 102); and a lapping step for lapping the chamfered wafer (step 104).

Figure 7:
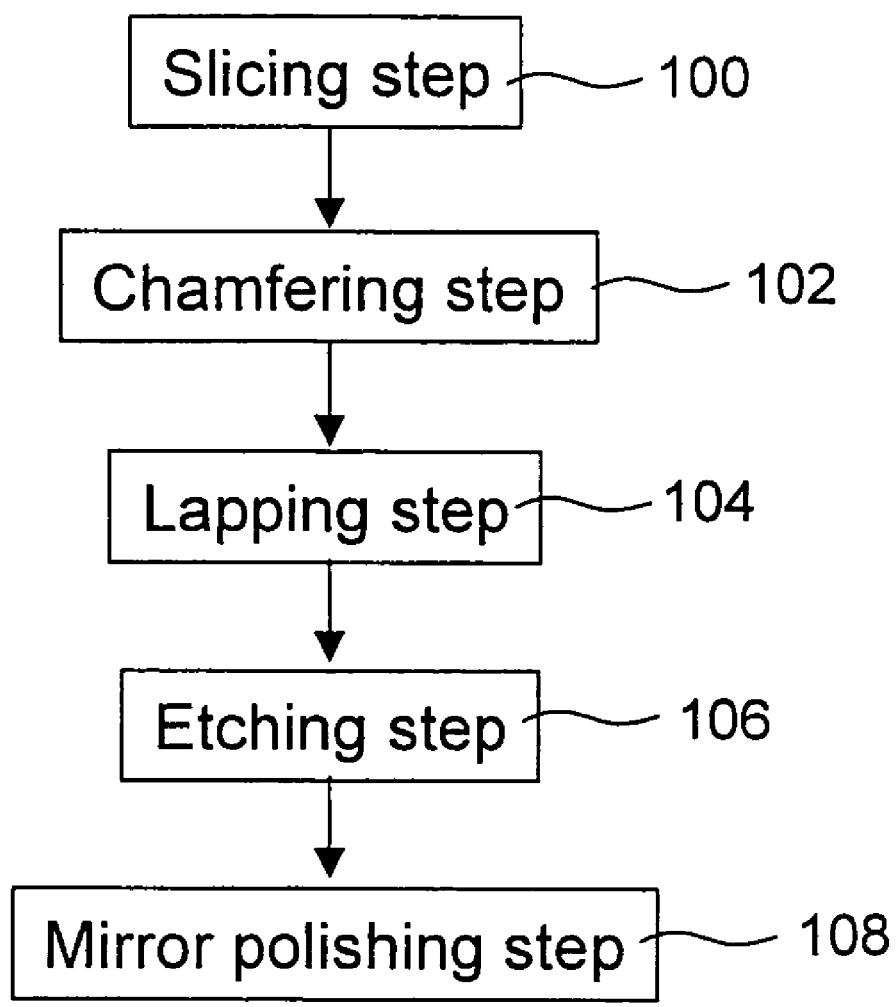
FIG. 7 is a flowchart showing an example of a step sequence of a conventional method for manufacturing a semiconductor wafer.

In the conventional method of FIG. 7, the lapped wafer is immediately etched, but in the method of the present invention, the lapped wafer is again chamfered (a second chamfering step, step 105). The twice chamfered wafer is subjected to alkali etching treatment (an etching step, step 106). The etched wafer is subjected to back surface part polishing and edge polishing treatment (a back surface part polishing and edge polishing step, step 107ab). The back surface part polishing and edge polishing step includes: edge polishing treatment for edge polishing only the chamfered portion and in addition to that back surface part polishing treatment for mirror polishing the inner part extending inward from the boundary between the chamfered portion and the back surface of the wafer.

Light polishing is performed if necessary on the back surface of the wafer subjected to the back surface part polishing and edge polishing step (a back surface light polishing step, step 107c). There is fixed with, for example, wax the back surface of the wafer subjected to the back surface part polishing and edge polishing step or in addition to that the back surface light polishing step, and the front surface thereof is mirror polished (a front surface polishing step, step 108).

Incidentally, in the flowchart shown in FIG. 1, the back surface part polishing and edge polishing step (step 107ab) includes: ordinary edge polishing for edge polishing only the chamfered portion and also back surface part polishing for mirror polishing the inner part extending inward from the boundary between the chamfered portion and the back surface of the wafer, whereas as shown in FIG. 2, the back surface part polishing treatment and the edge polishing treatment are divided into a back surface part polishing step (step 107a) and an edge polishing step (step 107b), which can be implemented separately. Moreover, in this case, the edge polishing step (step 107b) can be even omitted.

Further detailed description will be given below of each of the steps shown in the flowchart of a method for manufacturing a semiconductor wafer according to the present invention of FIG. 1.

(A Slicing Step, Step 100)

An ingot of silicon or the like grown by the Czochralski method, the floating zone method or the like is sliced into wafers each in the shape of a thin plate in the slicing step by an inner diameter saw slicer or a wire saw.

(A First Chamfering Step, Step 102)

Then, if a sliced wafer obtained by slicing the single crystal rod is immediately lapped, the wafer is easy to be broken during lapping due to the presence of edges at the outer periphery of the wafer, and scratches and other damages occur during lapping by the action of chips and fragments generated as a result of the breakage. Therefore, by performing preliminary chamfering in advance, breakage of the wafer is prevented and therefore, scratches are prevented from occurring on the wafer, and furthermore, flatness of main surfaces of the wafer at the end point of lapping is prevented from degradation.

For the chamfering treatment performed at this stage, it is enough to employ chamfering treatment performed under rougher quality control compared with the ordinary chamfering treatment; therefore, the first chamfering step can be performed using an inexpensive chamfering machine inferior in precision and functionality. For example, in this chamfering step, while rotating a wafer held on a grinding stage (vacuum chuck) at a low speed, by pressing the wafer against a grinding stone rotating at a high speed under a predetermined load, the wafer is ground and chamfered tracing a profile of a groove of the grinding stone. It is needless to say that the first chamfering treatment can also be performed using a chamfering machine excellent in precision and functionality, which is usually employed when chamfering a wafer. On this occasion, a chamfering width in the preliminary chamfering treatment performed prior to lapping is determined based on a chamfering width at the end of lapping taking into consideration that thickness of the wafer is reduced by lapping and in company therewith the chamfering width is also reduced.

(A Lapping Step, Step 104)

Main surfaces of a silicon wafer are lapped using loose abrasive grains of FO abrasive grains #1200 or more produced by Fujimi Incorporated. Especially, it is preferable that the abrasive grains are of #1500 or more. Description will be concretely given of a lapping method adopted in a lapping step of the present embodiment. The lapping method is performed using a lapping machine in which wafers are held in planetary carriers and the carriers are subjected to planetary motion to thereby lap both surfaces of the wafers simultaneously between upper and lower lapping tables. The above FO grains were used as loose abrasive grains. The FO grains are fine grain abrasive based on pulverized alumina, which is artificial emery abrasive made of a mixture of brown alumina abrasive grains and zircon abrasive grains. For example, abrasive grains of #1200 have an average grain size of the order of 7 μm to 8 μm. It is preferable to employ abrasive grains finer than the abrasive grains of #1200. By lapping a wafer with abrasive grains having such average grain size prior to alkali etching, generation of deep pits and the like can be prevented. With the above lapping method, the wafers are lapped on both surfaces of the order of 20 μm to 100 μm. The thus lapped wafer has a stable quality of a surface state, which is a preferable surface state for the next step.

(A Second Chamfering Step, Step 105)

In a method for manufacturing a semiconductor wafer according to the present invention, chamfering is again performed after lapping. In the second chamfering step, as in the first chamfering step, while rotating a wafer held on a grinding stage (vacuum chuck) at a low speed, by pressing the wafer against a grinding stone rotating at a high speed under a predetermined load, the wafer is ground and chamfered tracing a profile of a groove of the grinding stone, which is implemented using a chamfering machine more excellent in precision and functionality than that in the first chamfering step. With this second chamfering step applied, a semiconductor wafer can be manufactured without losing smoothness and dimensional precision of a chamfered surface at the end of the chamfering treatment. Furthermore, a lapped wafer has uniform thickness, so in the subsequent second chamfering, it is also advantageous to easily ensure dimensional precision of a chamfered surface. A chamfering width in the second chamfering performed after lapping is generally in the range of 400 µm to 500 µm.

The example of the step sequential described above is presented as a preferable example and no specific limitation is imposed thereon, and there are conceivable various kinds of changes in respect of the above steps, such as addition of a surface grinding step and replacement of the lapping step with the surface grinding step. By implementing the above steps, a high flatness level of a wafer is ensured to a certain extent.

(An Etching Step, Step 106)

Then, alkali etching is preferably performed in the etching step. The etching is performed using an alkali aqueous etching solution at an alkali component concentration of 50 wt % or higher. An alkali component used in an etching solution of this embodiment is not limited to specific one and any can be employed as far as it can etch silicon; preferable examples in terms of an etching capability are hydroxides of alkali metals such as sodium hydroxide and potassium hydroxide and the most preferable one is sodium hydroxide. The alkali components described above may be used alone or in a mixture of plural components. For example, a mixture of sodium hydroxide and potassium hydroxide may be used and sodium hydroxide may be used alone.

Stock removal in thickness (etched thickness) of a silicon wafer removed by an etching step in the present invention is only required to be the lowest thickness capable of removing processing damage without any specific limitation thereon; the stock removal total on the both surfaces is in the range of 15 µm to 40 µm in view of variations of the penetration depth of processing damage to be removed. The stock removal in thickness of the silicon wafer can be controlled mainly by adjusting a time for which the silicon wafer is immersed in an etching solution. On the other hand, an immersion time of the silicon wafer in the etching solution is set in a relationship between an etched thickness and a concentration of the etching solution; it is preferable to set a time so that an etched thickness falls in the range of 15 µm to 40 µm and the immersion time is usually on the order of 5 min to 60 min. Incidentally, in the present invention, when immersing the silicon wafer in the etching solution, there may be additionally adopted conventional methods in which the silicon wafer is immersed in the etching solution while being vibrated therein, an ultrasonic wave is applied to the etching solution, or others so that the wafer is uniformly etched. By applying the alkali etching to the wafer, glossiness of the wafer takes a value in the range of 15% to 30%.

Note that the glossiness is measured substantially in conformity with JIS Z8741 (Method for measuring specular glossiness) with a gloss meter-SD designated by JIS. The glossiness is a value evaluated under conditions that brightness in a state where nothing is placed at a position of an object is assumed to be 0% for convenience and glossiness of a mirror polished wafer is set at 100%.

(A Back Surface Part Polishing and Edge Polishing Step, Step 107ab)

Figure 4:
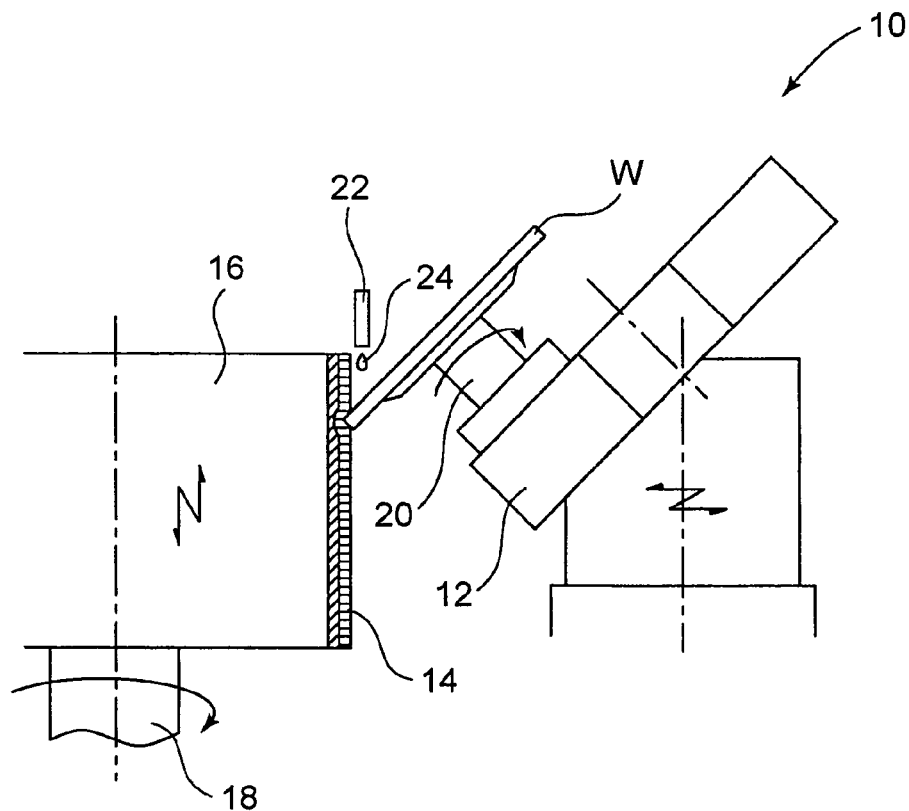
FIG. 4 is a schematic descriptive side view showing an example of an edge polisher.

Next, the back surface part polishing and edge polishing step is implemented using an edge polisher as shown in FIG. 4, for example. FIG. 4 is a schematic descriptive side view showing an example of an edge polisher. In FIG. 4, numerical reference 10 designates an edge polisher, which includes a wafer rotating device 12 rotating and holding a wafer W, and a rotary drum 16 on which a buff 14 is attached in a cylindrical shape. The cylindrical buff 14 is of a structure rotating at a high speed on the order of 800 rpm to 3000 rpm with a rotation axis 18 of the rotary drum 16 as the center and the cylindrical buff (polishing pad) 14 is attached on the outer surface of the rotary drum 16 so as to cover all the outer surface in close contact therewith. The wafer W is held on the wafer rotating device 12, rotates about the rotation axis 20 as the center in an inclined state at an angle of the order of 45 to 55 degrees to the rotary drum 16, and traverses in a vertical direction. A nozzle 22 is disposed above the contact point of the wafer W with the buff (polishing pad) 14 and supplies a processing liquid 24 quantitatively. In edge polishing, while simultaneously rotating the rotary drum 16 and the wafer W, the wafer W is brought into contact with the rotary drum 16 at an angle of about 55 degrees to the rotating drum 16. The outermost end of the edge portion of the wafer W is mirror polished in a state where the outermost end sinks into the cylindrical buff (polishing pad) 14.

At this time, edge polishing is performed such that an extending area (width) of a part to be mirror polished by the edge polishing action on the back surface of the wafer, that is, an area to be mirror polished of an inner part extending toward the center of the wafer from the boundary between a chamfered portion and the back surface of the wafer is preferably 1000 µm or less, more preferably 500 µm to 700 µm.

In the present invention, the effect thereof is attained by mirror polishing a part of an outer peripheral portion on the back surface of a wafer and it is preferable that an area of the mirror polished part is properly set depending on a polishing machine polishing the front surface of the wafer and polishing conditions, whereas the mirror polishing is performed such that a mirror polished area of an inner part extending toward the center of the wafer from the boundary between a chamfered portion and the back surface of the wafer is in the range up to about 1000 µm, preferably in the range of 500 µm to 1000 µm. By mirror polishing the above mentioned area, a sufficient flatness level can be ensured even with a polishing machine of a wax mount system and furthermore, a part of an outer peripheral portion of the back surface of the wafer can be easily mirror polished only by employing a conventional edge polisher with modifications on a buff to be used and edge polishing conditions. Incidentally, while the above mentioned area of less than 500 µm exerts the effect of improvement on the flatness, in order to obtain a wafer with flatness at a level high enough for future requirements, the area to be mirror polished is preferably 500 µm or more, more preferably in the range of 500 µm to 700 µm. By employing the polishing manner described above, there can be attained a wafer which has high flatness up to the wafer peripheral portion and the back surface of which is ensured to be equivalent to that of a conventional etched wafer surface, the obtained wafer being easily handled in a device fabrication process.

The extending area of the edge polishing action can be controlled by adjusting an angle of the wafer to the rotary drum and changing a property of a buff, whereas especially when edge polishing a wafer subjected to chamfering steps before and after the lapping step such a step sequence as of the first chamfering step, the lapping step and the second chamfering step, the extending area of the edge polishing action can be exactly controlled with less of variations in the area width thereof.

Incidentally, in the flowchart of FIG. 1, there is shown an example where in the back surface part polishing and edge polishing step (step 107*ab*), there are simultaneously performed ordinary edge polishing treatment and back surface part mirror polishing treatment for mirror polishing an inner part extending toward the center of the wafer from the boundary between the chamfered portion and the back surface of the wafer, while as shown in the flowchart of FIG. 2, it is as described above that the back surface part polishing step (step 107*a*) performing back surface part polishing and the edge polishing step (step 107*b*) may be separately performed.

(A Wafer Back Surface Light Polishing Step, Step 107*c*)

The wafer back surface (main surface) may be further polished by a very small amount. Though such a step is not necessarily required, it may be added for adjustment of glossiness of the back surface and improvement on flatness. In this step, a polishing machine generally employed is used to polish the back surface by very small stock removal (1 μm or less).

With such a wafer back surface light polishing step additionally adopted, glossiness of a wafer back surface among wafers can be uniform and a back surface can be obtained with glossiness of the order of 40±5%.

(A Front Surface Mirror Polishing Step, Step 108)

Figure 5:
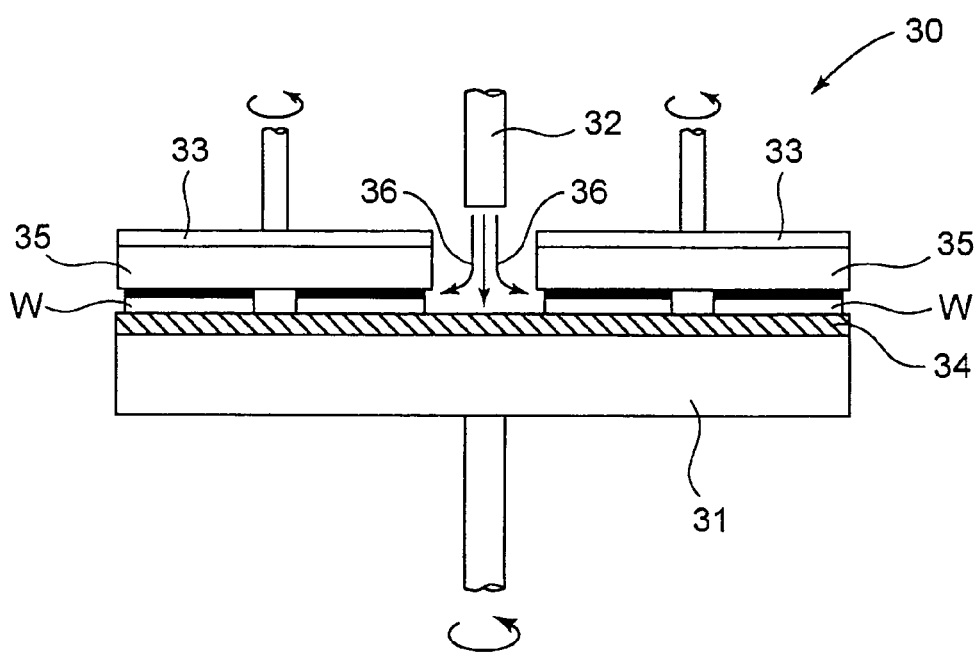
FIG. 5 is a schematic descriptive side view showing an example of a polishing machine.

Finally, in the front surface polishing step, a front surface of a wafer is mirror polished. In this embodiment, a main surface (front surface) side of a wafer is mirror polished by means of a polishing method of a wax mount system as an example. In this mirror polishing, a polishing machine as shown in FIG. 5, for example, is used. FIG. 5 is a schematic descriptive side view showing an example of a polishing machine.

In FIG. 5, numerical reference 30 designates a polishing machine which includes a polishing table 31, a polishing agent supply means 32, a polishing head 33, a head rotating means (not shown) and a table rotating means (not shown). After a wafer W is adhered with wax to a polishing block 35 by the back surface thereof, the polishing block 35 is placed under the polishing head 33 and a front surface of the wafer W is brought into contact with a polishing cloth 34. Then, the polishing head 33 is moved down and the front surface of the wafer W is pressed down onto the polishing cloth 34 with the polishing block 35 interposed therebetween. While the head rotating means and the table rotating means are driven and polishing slurry 36 is supplied from a nozzle of the polishing agent supply means 32, the front surface of the wafer W and the polishing cloth 34 are rubbed against each other to thereby polish the front surface of the wafer W. After the mirror polishing ends, the polishing head 33 is moved upward to take out the polishing block 35 and to peel off the wafer W therefrom. The polishing block 35 is a block made of ceramics and grooves of a lattice pattern is formed across the entire surface thereof (a surface for adhering a wafer). This type of polishing block is usually used.

Figure 6:
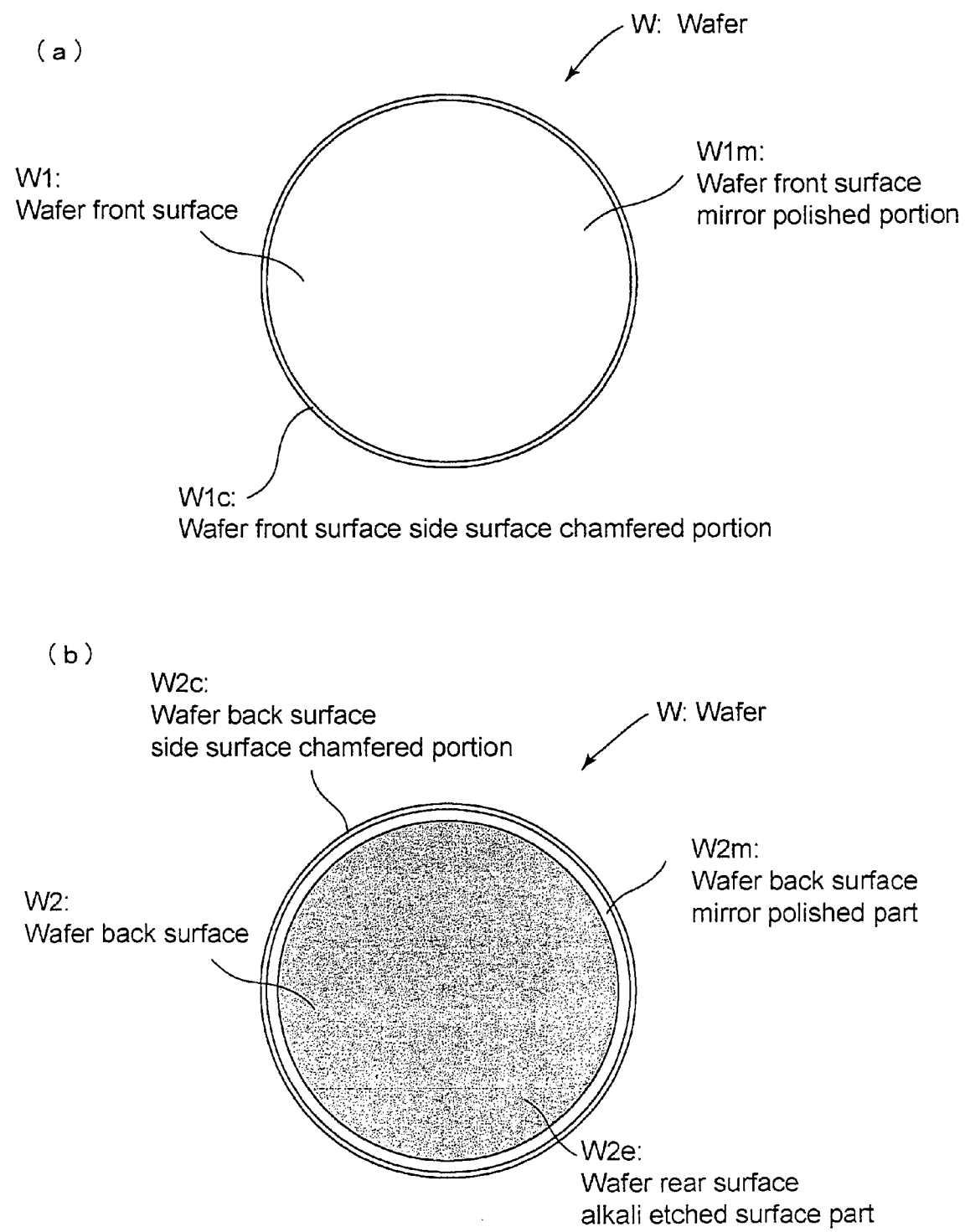
FIG. 6 is a descriptive view of a wafer polished according to the method of the present invention, wherein the part (a) shows a wafer front surface and the part (b) shows the wafer back surface.

By applying the steps described above, as schematically shown in FIG. 6, there can be manufactured a wafer wherein the wafer front surface W1 is mirror polished to a high flatness level, and the wafer back surface W2 has a mirror polished part W2*m* in the outer peripheral portion and an alkali etched surface part W2*e* in the central portion.

There is available a preferable wafer wherein the mirror polished part W2*m* is 1000 μm or less, especially in the range of 500 μm to 700 μm in width extending toward the center of the wafer from the boundary between the chamfered portion and the back surface of the wafer. Incidentally, at a stage prior to mirror polishing on the part in the outer peripheral portion of the back surface of the wafer, the boundary between the wafer main surface and the chamfered portion is definite and hence the area of the mirror polished part W2*m* can be easily controlled, but in the edge polished wafer both the main surface and the boundary of the chamfered portion are mirror polished and hence the boundary is hard to be exactly discriminated.

Since a width of the chamfered portion has no special influence in the present invention, it is defined that the area of the mirror polished part is a distance extending from the boundary between the main surface and the chamfered portion. In order to describe the wafer obtained according to the present invention, the area of the mirror polished part may be defined by an area including the chamfered portion. For example, a wafer having a polished part of 600 μm in width extending toward the center of the wafer from the boundary between the wafer chamfered portion and the main surface of the wafer is in other words, in a case of a specification of the chamfering width of 400 μm, a wafer having a polished part of 1000 μm in width extending toward the center of the wafer from the outermost periphery of the wafer (the chamfering width of 400 μm+the inner part width of 600 μm extending toward the center of the wafer from the boundary).

Since a standard of chamfering width is usually on the order of 400 μm to 500 μm, a wafer may be defined in specifications in consideration of the standard. A wafer obtained in the above-described manufacturing process can be easily at a level with SFQRmax of 0.09 μm to 0.11 μm.

In recent years, development has been done on a process for manufacturing a wafer with high flatness by mirror polishing the wafer on both sides. There is a case where a wafer with a mirror polished back surface is currently not accepted since a problem occurs as to affinity with an apparatus used in a device fabrication process, and currently in more cases, it is necessary for a wafer back surface to be as etched.

In a dry etching apparatus or the like used in a device fabrication process, for example, there becomes an issue roughness or the like on a wafer back surface from an aspect of temperature control and hence in more cases, an apparatus is currently calibrated with a wafer having a back surface in an etched state. In a prior art, a wafer having the back surface in an etched state cannot have sufficient flatness, especially a desired configuration of a wafer outer peripheral portion.

In the wafer of the present invention, there is mirror polished an inner part extending inward from the boundary between a chamfered portion and a wafer back surface and therefore only an outer peripheral portion of the wafer back surface (especially a small area of a width of the order of 1000 μm) is in a mirror polished state; the wafer can be treated in the same conditions as a wafer having conventionally used in a device fabrication process as described above without an adverse influence of the back surface roughness and is a wafer with a good flatness level, leading to an advantage of improvement on product yield and others on the side of a device maker.

EXAMPLES

While further concrete description will be given of the present invention, showing examples below, it is needless to say that the examples are presented by way of illustration and should not be construed by way of limitation.

Examples 1 and 2, and Comparative Example 1

A p-type silicon single crystal ingot having a diameter of about 200 mm (8 inches) and the resistivity of about 10 Ω·cm was obtained by the Czochralski method. The obtained ingot was processed according to a process similar to that shown in the flowchart of FIG. 1 to manufacture semiconductor wafers each having one mirror polished surface.

First, the ingot described above was sliced into wafers and an outer peripheral portion of the sliced wafer was roughly chamfered (the first chamfering). Then, a main surface of the roughly chamfered silicon wafer was lapped using FO abrasive grains #1500 as loose abrasive grains. In this lapping step, the stock removal total on the both surfaces of the wafer is on the order of 70 μm. Then, the outer peripheral portion of the wafer was further chamfered to obtain a chamfered configuration meeting a specification (the second chamfering).

Next, an etching step was performed using a 55 wt % sodium hydroxide aqueous solution. The silicon wafer was immersed in an etching solution at 80° C. to etch the wafer by the stock removal total on the both surfaces of about 20 μm. By the etching treatment, an etched wafer (CW) was obtained with glossiness on the order of 15 to 25%. Thereafter, the back surface of the etched wafer was polished so as to be 40±5% of glossiness.

In the present invention, as shown in the flowchart of FIG. 1, in order to make the outer peripheral portion of the wafer main surface mirror polished, an edge polishing step was applied at this stage. Especially, the edge polishing was performed for mirror polishing not only the chamfered portion, but also the inner part of the main surface extending inward from the boundary between the chamfered portion and the main surface. Incidentally, as shown in the flowchart of FIG. 2, it may be available that the treatment making the chamfered portion mirror polished is implemented in a separate step and at this stage, only the outer peripheral portion of the main surface (back surface) of the wafer is mirror polished. After the alkali etching, thus the configuration of the outer peripheral portion of the back surface of the wafer is modified prior to the wafer front surface polishing. As shown in the flowchart of FIG. 1, however, the back surface part polishing is preferably performed simultaneously with the edge polishing because of simplicity of the process.

In the edge polishing, with an edge polisher as shown in FIG. 4 using a non-woven cloth of polyester felt impregnated with polyurethane as a buff and an alkali solution containing colloidal silica as slurry, the wafer was edge polished at a wafer angle of 55°. Furthermore, by changing such conditions that a contact pressure and others were adjusted or the non-woven cloth made of two layers with different hardness values was used, in addition to the chamfered portion the outer peripheral portion of the wafer main surface was mirror polished up to an optional position.

Plural starting wafers were prepared according to the above steps. The starting wafer 1 (Example 1) was prepared by mirror polishing the inner part of 200 μm to 300 μm extending toward the center of the wafer from the innermost edge of the chamfered portion, and the starting wafer 2 (Example 2) was prepared by mirror polishing the inner part of 600 μm to 700 μm. In addition, the starting wafer 3 (Comparative Example 1) was prepared by edge polishing only the chamfered portion without making the outer peripheral portion of the main surface mirror polished.

The back surface of each of the starting wafers described above was adhered according to the wax mount system and the one surface (the front surface) of the wafer was polished with the polishing machine as shown in FIG. 5. To be concrete, there was used a polishing block prepared by forming lattice-like grooves of each of a width of 100 μm, a depth of 15 μm and a pitch of 3 mm on a sintered alumina compact with a diameter of 630 mm and a thickness of 20 mm. There was used as wax "sky liquid" produced by Nikka Seiko Co., Ltd. and seven 8-inch wafers (a diameter of 200 mm) were adhered on the polishing block. With the polishing machine, the polishing block on which the wafers were adhered was pressed down under a pressure and the wafers were polished on a polishing cloth while supplying the polishing slurry to polish them with the stock removal of the order of 10 μm. In this case, the polishing slurry used was an alkali solution containing colloidal silica (a pH value of 10.5) and the polishing cloth used was a non-woven cloth of urethane. After the mirror polishing was over, the wafers were peeled off and subjected to cleaning.

With the above steps applied, a wafer was obtained such that the front surface of the wafer was mirror polished and the outer peripheral portion in the back main surface thereof was polished in the range of 200 μm to 300 μm (since the chamfered portion of the wafer obtained in this example is 400 μm, the wafer was obtained, in other words, a wafer with the outer peripheral portion of the back surface of the wafer being mirror polished in the range of 600 μm to 700 μm extending from the outermost periphery of the wafer) (Example 1). Similarly, a wafer was obtained such that the outer peripheral portion in the back main surface thereof was polished in the range of 600 μm to 700 μm (a wafer with the outer peripheral portion of the back surface of the wafer being mirror polished in the range of 1000 μm to 1100 μm extending from the outermost periphery of the wafer, Example 2) and a wafer was obtained such that the front surface and the chamfered portion were mirror polished (Comparative Example 1).

Figure 3:
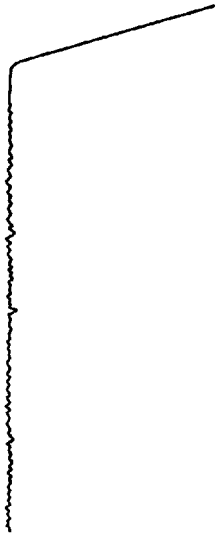
FIG. 3 is graphs and map diagrams showing configurations of starting wafers and mirror polished wafers in Examples 1 and 2, and Comparative Example 1.

Inspection was performed on a wafer configuration of each of the wafers of Examples 1 and 2 and Comparative Example 1 with a flatness meter (produced by ADE Corporation with a trade name of U/S9800). An SFQR value was evaluated with a cell size of 25 mm×25 mm and an area of a wafer except an annular region with a width of 2 mm from the outermost periphery thereof (E. E. 2 mm). There were obtained: a configuration of the boundary of the chamfered portion each of the starting wafers prior to mirror polishing; two dimensional map diagrams of the whole each of the starting wafers; two dimensional map diagrams of the whole each of the polished wafers; and SFQRmax values each of the polished wafers. The results are shown in FIG. 3.

Consequently, in a case where the starting wafer 3 (Comparative Example 3) was used, ring-like sag is observed in the outer peripheral portion of the wafer after mirror polishing. In this wafer, the sag is started at a distance of the order of 10 mm from the outermost periphery. Under the influence of the sag, the SFQRmax value is on the order of 0.20 µm. In Examples 1 and 2 wherein after the mirror polishing was performed on the inner part extending inward from the boundary between the main surface and the chamfered portion in the back surface of the starting wafer, the front surface thereof was mirror polished, the SFQRmax values are improved and it is found from the map diagrams after the mirror polishing that a density of the contour lines in the outer peripheral portion of the wafer is low; a wafer with high flatness has been manufactured. Especially, in Example 2, a wafer with very high flatness of the SFQRmax value of 0.09 was manufactured.

In Comparative Example 1 in which no mirror polishing was performed on the inner part extending inward from the boundary between the main surface and the chamfered portion in the back surface of the wafer, it is conceivable that the boundary of the chamfered portion is of an angular configuration, which causes sag on the polished wafer. By mirror polishing the extending inner part to make the portion slightly round as in Examples 1 and 2, a wafer with high flatness was manufactured.

Incidentally, there is a great difference between a width of the back surface part polishing and a width of an area generating the outer peripheral sag observed in Comparative Example 1, but even in a case of the part polishing on a small area (for example, about 1000 µm) as in the present invention, it is conceivable that an effect of the part polished area is extended to an area of about 10 mm extending from the outermost periphery of the wafer because of an influence of a stress or the like during the polishing.

In the conditions in the examples described above, with the mirror polished area of the inner part extending inward from the boundary between the chamfered portion and the back surface of the wafer being 600 µm to 700 µm, best flatness values of the wafers were exhibited. Under such conditions, the SFQRmax is stably 0.11 µm or less.

While description is given above of the embodiments and examples of the present invention, it is needless to say that the present invention is not limited to descriptions in the embodiments and examples and various modification and alterations in addition thereto can be implemented as far as those are still within the spirit and scope of the present invention.

CAPABILITY OF EXPLOITATION IN INDUSTRY

As described above, according to a method for manufacturing a semiconductor wafer of the present invention, a wafer can be manufactured without ring-like sag in the outer peripheral portion thereof when polishing an alkali etched wafer and the manufacturing method is especially effective in polishing according to a wax mount system. A wafer of the present invention has high flatness without ring-like sag in the outer peripheral portion thereof.

The invention claimed is:

1. A method for manufacturing a semiconductor wafer comprising: a back surface part polishing and edge polishing step for performing back surface part polishing and edge polishing such that mirror polishing is performed on a chamfered portion and an inner part; and a front surface polishing step for mirror polishing a front surface of the wafer subjected to the back surface part polishing and edge polishing step holding the wafer by the back surface thereof, wherein
the mirror-polished inner part extends circumferentially about the wafer and radially inwardly from a boundary defined as an interface between the chamfered portion of the wafer and a flat back surface of the wafer, the mirror-polished inner part extending radially inwardly from the boundary 1000 µm or less.

2. The method for manufacturing a semiconductor wafer according to claim 1, wherein the starting wafer is an alkali etched wafer.

3. The method for manufacturing a semiconductor wafer according to claim 1, wherein the wafer is adhered with wax and held by the back surface thereof and the front surface thereof is mirror polished.

4. The wafer according to claim 1, wherein glossiness of the flat back surface of the wafer is in the range of 40±5% and SFQRmax thereof is 0.11 µm or less.

5. A method for manufacturing a semiconductor wafer comprising: a back surface part polishing step for mirror polishing an inner part; and a front surface polishing step for mirror polishing a front surface of the wafer subjected to the back surface part polishing step holding the wafer by the back surface thereof, wherein
the mirror-polished inner part extends circumferentially about the wafer and radially inwardly from a boundary defined as an interface between a chamfered portion of the wafer and a flat back surface of the wafer, the mirror-polished inner part extending radially inwardly from the boundary 1000 µm or less.

6. The method for manufacturing a semiconductor wafer according to claim 5, further comprising: an edge polishing step for edge polishing the wafer subjected to the back surface part polishing step, wherein the front surface of the edge polished wafer is mirror polished.

7. The method for manufacturing a semiconductor wafer according to claim 6, wherein the starting wafer is an alkali etched wafer.

8. The method for manufacturing a semiconductor wafer according to claim 5, wherein the wafer is adhered with wax and held by the back surface thereof and the front surface thereof is mirror polished.

9. The method for manufacturing a semiconductor wafer according to claim 5, wherein the starting wafer is an alkali etched wafer.

10. The wafer according to claim 5, wherein glossiness of the flat back surface of the wafer is in the range of 40±5% and SFQRmax thereof is 0.11 µm or less.

11. A method for manufacturing a semiconductor wafer comprising: a slicing step for slicing a single crystal rod into wafers each in the shape of a thin plate; a first chamfering step for chamfering the sliced wafers; a lapping step for lapping the chamfered wafers; a second chamfering step for chamfering the lapped wafers for the second time; an etching step for alkali etching the twice chamfered wafer; a back surface part polishing step for mirror polishing an inner part; and a front surface polishing step for mirror polishing a front surface of the wafer subjected to the back surface part polishing step holding the wafer by the back surface thereof, wherein
the mirror-polished inner part extends circumferentially about the wafer and radially inwardly from a boundary defined as an interface between a chamfered portion of the wafer and a flat back surface of the wafer, the mirror-polished inner part extending radially inwardly from the boundary 1000 µm or less.

12. The method for manufacturing a semiconductor wafer according to claim 11, wherein the wafer is adhered with wax and held by the back surface thereof and the front surface thereof is mirror polished.

13. The wafer according to claim 11, wherein glossiness of the flat back surface of the wafer is in the range of 40±5% and SFQRmax thereof is 0.11 µm or less.

14. A method for manufacturing a semiconductor wafer comprising: a slicing step for slicing a single crystal rod into wafers each in the shape of a thin plate; a first chamfering step for chamfering the sliced wafers; a lapping step for lapping the chamfered wafers; a second chamfering step for chamfering the lapped wafers for the second time; an etching step for alkali etching the twice chamfered wafer; a back surface part polishing step for mirror polishing an inner part; and a front surface polishing step for mirror polishing a front surface of the wafer subjected to the back surface part polishing step holding the wafer by the back surface thereof, wherein the mirror-polished inner part extends circumferentially about the wafer and radially inwardly from a boundary defined as an interface between a chamfered portion of the wafer and a flat back surface of the wafer, the mirror-polished inner part extending radially inwardly from the boundary 1000 µm or less.

15. The method for manufacturing a semiconductor wafer according to claim 14, further comprising: an edge polishing step for edge polishing the wafer subjected to the back surface part polishing step, wherein the front surface of the edge polished wafer is mirror polished.

16. The method for manufacturing a semiconductor wafer according to claim 14, wherein the wafer is adhered with wax and held by the back surface thereof and the front surface thereof is mirror polished.

17. The wafer according to claim 14, wherein glossiness of the flat back surface of the wafer is in the range of 40±5% and SFQRmax thereof is 0.11 µm or less.

18. A wafer, wherein a front surface thereof is a mirror polished surface and the back surface thereof is an alkali etched surface, and wherein the back surface has a mirror-polished inner part extending circumferentially about the wafer and radially inwardly from a boundary defined as an interface between an outer peripheral chamfered portion of the wafer and the back surface thereof, the mirror-polished inner part extending radially inwardly from the boundary in the range of 500 µm to 700 µm.

19. The wafer according to claim 18, wherein glossiness of the back surface of the wafer is in the range of 40±5% and SFQRmax thereof is 0.11 µm or less.

* * * * *